United States Patent [19]

Ozaki et al.

[11] Patent Number: 4,765,055
[45] Date of Patent: Aug. 23, 1988

[54] METHOD OF FABRICATING A SUPERCONDUCTING CAVITY

[75] Inventors: Masanori Ozaki, Nikko; Isamu Ohishi, Yokohama; Norimasa Sato, Utsunomiya; Yasuzou Tanaka, Yokohama, all of Japan

[73] Assignee: The Furukawa Electric Co., Ltd., Tokyo, Japan

[21] Appl. No.: 897,740

[22] Filed: Aug. 18, 1986

[30] Foreign Application Priority Data

| Aug. 26, 1985 | [JP] | Japan | 60-186798 |
| Sep. 30, 1985 | [JP] | Japan | 60-216726 |
| Oct. 15, 1985 | [JP] | Japan | 60-229471 |
| Oct. 15, 1985 | [JP] | Japan | 60-229472 |
| Oct. 15, 1985 | [JP] | Japan | 60-229473 |
| Oct. 15, 1985 | [JP] | Japan | 60-229474 |

[51] Int. Cl.$^4$ ............................................. H01L 39/24
[52] U.S. Cl. .......................................... 29/599; 333/995
[58] Field of Search ............. 29/402.18, 402.19, 599; 333/99 S

[56] References Cited

U.S. PATENT DOCUMENTS

| 4,052,784 | 10/1977 | Diepers | 29/599 |
| 4,115,916 | 9/1978 | Meyerhoff | 29/599 |
| 4,397,081 | 8/1983 | Ziemek et al. | 29/599 |

FOREIGN PATENT DOCUMENTS

60-261202 12/1985 Japan.
60-261203 12/1985 Japan.

Primary Examiner—P. W. Echols
Assistant Examiner—Carl J. Arbes
Attorney, Agent, or Firm—Frishauf, Holtz, Goodman & Woodward

[57] ABSTRACT

A method of inexpensively fabricating a superconducting cavity having thin, clean, and smooth superconductive films of excellent resonance characteristics, and the steps of forming a first thin film layer made of hydrogen transmission-preventive metal on the outer periphery of the core made of a metal having a higher ionization tendency than hydrogen in the electrochemical series, then forming a second thin film layer of superconducting material on the outer periphery of the first thin film layer, forming a third thin film layer made of a metal having a high thermal conductivity and a high bondabilty on the outside of the second thin film layer, forming a reinforced coating layer of stabilizing metal through composite fiber plated with copper on tungsten fiber on the third thin film layer, forming a cooling pipe on the outside, and then removing the core and the first thin film layer by dissolving with the surface of the superconductor being a replica of the core surface.

13 Claims, 6 Drawing Sheets

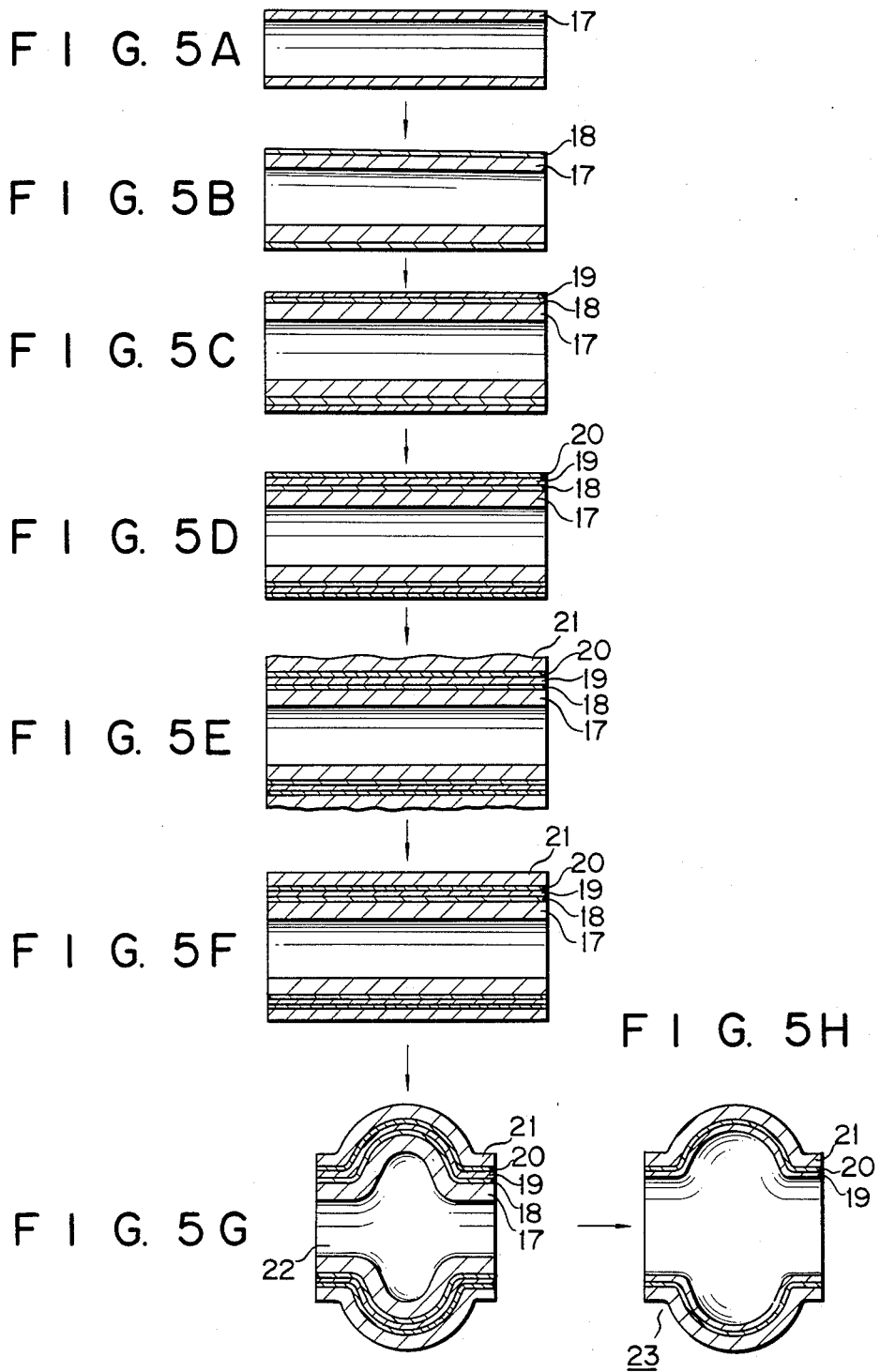

F I G. 6A
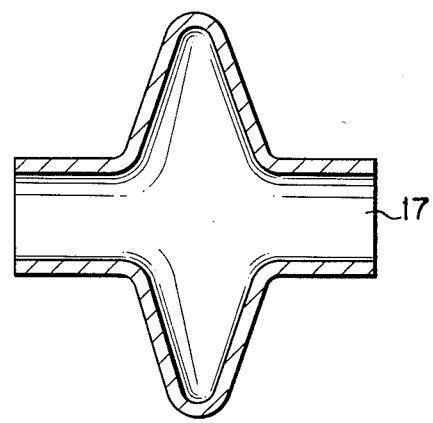
F I G. 6B
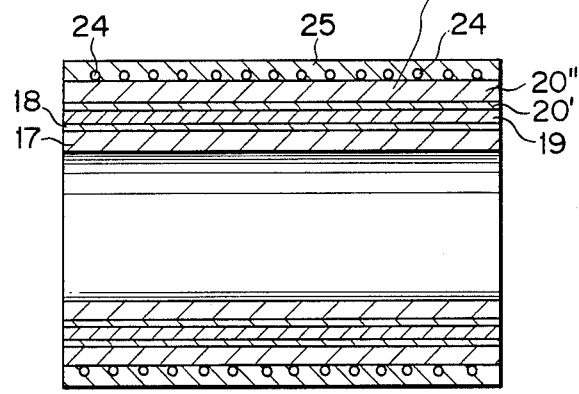
F I G. 6C
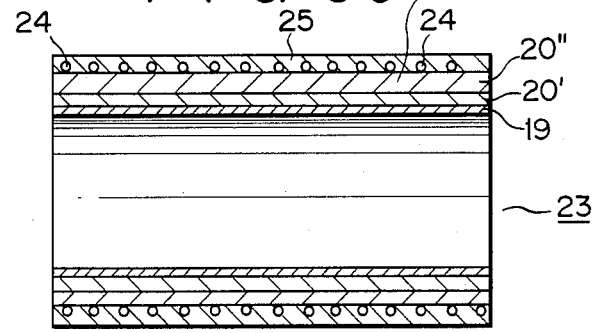

METHOD OF FABRICATING A SUPERCONDUCTING CAVITY

BACKGROUND OF THE INVENTION

The present invention relates to improvements in a method of fabricating a superconducting cavity and, more particularly, to an inexpensive fabrication of superconducting cavities characterized by a thin superconductive film having excellent resonance characteristic, by using a PVD (Physical Vapor Deposition) method.

Superconducting cavities (cavity resonator) have been heretofore fabricated by the following steps:

(1) Three types of elements 2, 2′, and 3 for cavities, are formed by spinning, drawing, or grinding a niobium (Nb) plate, as shown in FIG. 1. The elements are welded by an electron beam welding method, the inner surfaces of the elements are then electrolytically polished with a mixture of fluoric acid and sulfuric acid, to smoothen the inner surfaces, and impurities are removed, to provide superconducting cavities 1.

In order to improve the smoothness of the inner surfaces of the elements as much as possible, the elements are welded by emitting an electron beam from the inside. Since niobium has a high melting point of 2415° C. and excellent corrosion resistance, it is difficult to form a thin film by an electric plating, in order to provide a plated film of high quality.

(2) A niobium pipe is expanded in diameter by a hydraulic bulging method, to provide a product. Since the niobium pipe cannot be expanded to the necessary shape, in one step, the pipe must be slightly expanded while annealing in a vacuum, during the course of the step.

Since the niobium layer is thus formed by welding, a stepped portion can be feasibly formed on the welded portion, thereby deteriorating the high-frequency, and the superconducting characteristics. Since niobium having low thermal conductivity is used and the niobium layer may be as thick as several mm, if the film has a defect or contains any foreign matter, high-frequency loss heat can be dissipated only with difficulty, thereby causing the superconducting characteristics to decrease. Since the niobium is heated to high temperatures by annealing and welding, it therefore tends to be oxidized. In order to prevent the niobium from oxidizing, vacuum annealing and electron beam welding are required, thereby resulting in a high cost. Since there is a danger of damaging the superconducting state due to the introduction of impurities such as iron or dusts from the surface of the mechanical forming niobium, it is necessary to electrolytically polish it with a mixture of fluoric acid and sulfuric acid, electrolytic polishing is dangerous and involves complicated steps, thereby causing reduced productivity.

The inventors of the present invention have previously reduced the above-mentioned drawbacks, and proposed a method of fabricating a superconducting cavity comprising the steps of forming a hollow core made of aluminum or aluminum alloy having a cross-shaped section, shaping the size of the outside of the core to be the same as the inside of a desired superconducting cavity, contacting a thin niobium film on the outer periphery of the core, then forming a copper coating layer through a thin copper film on the outer periphery, in the shape of the cavity, and melting the core of aluminum or aluminum alloy (Japanese Patent Application No. 116691/1984), and a method of fabricating a superconducting cavity comprising the steps of forming a core of an aluminum or aluminum alloy pipe having a desired shape, forming a thin niobium film on the outer periphery, then forming a copper coating layer through a thin copper film on the outside, expanding the core in diameter and them melting and removing the core (Japanese Patent Application No. 116692/1984).

The reason aluminum or aluminum alloy (hereinafter referred to "aluminum") is used in this method is because it has suitable strength in the case of fabricating the core, it has high workability, thus improving the stability of the shape, and has preferable smoothness as well as having a high melting velocity in the melting and removing steps of the aluminum core in the later steps. These qualities thus make aluminum economical to use in this process. However, since the thin niobium film is, on the contrary, formed directly on the outer periphery of the aluminum, the niobium is embrittled on the outer periphery by hydrogen generated at the time of reacting with the aluminum, in the step of melting the aluminum with hydrochloric acid, as described above, and even if the aluminum is melted and removed, the superconducting characteristic of the niobium is remarkably deteriorated.

SUMMARY OF THE INVENTION

An object of the present invention is to provide a method of fabricating a superconducting cavity which has a clean and smooth thin superconducting film of excellent resonance characteristic and which is low in cost, as a result of studies of the above-mentioned drawbacks of the conventional superconducting cavity.

According to one aspect of the present invention, there is provided a method of fabricating a superconducting cavity comprising the steps of using a core made of a metal having a higher ionization tendency than hydrogen in the electrochemical series, forming a first thin film layer made of hydrogen transmission-preventive metal on the outer periphery of the core, then closely contacting a second thin film layer of niobium or superconducting intermetallic compound on the outer periphery of the first thin film layer, forming a third thin film layer made of metal having high thermal conductivity such as Cu or Al and high bondability on the outside of the second thin film layer, forming a reinforced coating layer of stabilizing metal on the third thin film layer to be formed in the shape of a superconducting cavity, and then dissolving the core and the first thin film layer.

According to another aspect of the present invention, there is provided a method of fabricating a superconducting cavity comprising the steps of forming the shape of a superconducting cavity, and then forming a cooling metal pipe through a stationary layer of stabilizing metal of copper on the outside thereof.

According to still another aspect of the present invention, a method of fabricating a superconducting cavity may comprise the step of forming a coating layer of stabilizing metal, such as copper, by an electrodeposition as a reinforced coating layer of stabilizing metal, or forming a coating layer of copper by an electrodeposition through a winding layer of a composite fiber or woven cloth of either one of tungsten, carbon, and silicon carbide placed with copper or copper alloy.

The method of the present invention provides a cooling metal pipe through a stabilizing metal, such as copper, on the outside of the coating layer of stabilizing metal. The core in the method of the present invention uses at least one selected from a group consisting of Mg, Al, Zn, $Fe^{II}$, Cd, Co, Ni, Sn, Pb, and $Fe^{III}$.

The core made of a pure metal in the method of the present invention preferably has a purity of 99.9% or higher. The amount of impurities in the core made of an alloy in the method of the present invention is preferably not more than 0.1 wt.% in total. The precipitate may be suppressed by using base metal of 99.9 wt.% purity, thus facilitating removal of the core by dissolving. It is necessary to uniformly distribute the thickness of the thin PVD (Physical Vapor Deposition) film (thin niobium film) in the later step by reducing the maximum diameter of the precipitate to 0.3 micron or smaller, and decreasing the workable surface to $R_{max}$ 1 micron or smaller by electrolytic or chemical polishing.

Further, the core is formed in a tubular shape by hot working an ingot, and shaping it into a predetermined size. The reason the core is formed by working is because the crystalline grain size is aligned, to improve the workability. After the working, the core is preferably heated, stress is removed by heating, the exfoliation of the second and third thin film layers or of the third thin film layer and the reinforced coating layer by the stabilizing metal is prevented, and damage to the thin films is prevented when the core is removed by dissolving.

Referring to the main core shown in FIGS. 2(A), 2(B) and 2(C), the outside size of this core is formed to be the same size as the inside of a desired superconducting cavity, in the case of using cavity type hollow elements 11 or 11' having a cross-shaped sectional shape (A) or (B) or a cross-shaped sectional coupler (C). In other words, a metal tube is used, the tube is expanded in diameter into a predetermined shape by a bulging method or by utilizing electromagnetic impact stress to expand the tube, and the tube is annealed once or several times in the course of working, to form a predetermined profile size. In another method, the cores formed by splitting the metal forged ingot are welded, cut and polished, to be finished in a predetermined profile shape. Further, the metal forged ingot can be bored and formed on the outside in a predetermined shape by cutting, or discharge machining by boring and outside cutting, to be finished in a predetermined profile shape.

In the method of the present invention, the reason the first thin film layer is formed on the outer periphery of the core is because, when the second thin film layer of niobium or superconducting intermetallic compound is formed on the outside of the first thin film layer, the third thin film layer is further formed, thus forming a cavity, the metal core is then dissolved and removed by a solution of hydrochloric acid, hydrogen is generated by the reaction with the metal, and this embrittles the niobium, tin triniobate ($Nb_3Sn$), or superconducting intermetallic compound, thereby obstructing the superconductivity. Thus, the first thin film layer is formed with a thickness of 0.5 micron or larger between the metal core and the thin film of niobium or tin triniobate ($Nb_3Sn$). Even if hydrogen is generated by the reaction with the metal, the thin film prevents any influence to the niobium, tin triniobate ($Nb_3Sn$), or other superconducting intermetallic compound. The first thin film layer may be made of Cu, Ni, Fe, Pb, Ag, Cr, Mo, Zn or Cd.

When the first thin film layer has 0.5 micron or less, pinholes or other defects may occur in the thin film, and there is a danger that the hydrogen generated by the reaction with the metal during dissolution may be introduced into the niobium, to embrittle it.

In the method of the present invention, the thin film of superconducting niobium or intermetallic compound of niobium, e.g., tin triniobate ($Nb_3Sn$) is preferably reduced in thickness, and in order to avoid the introduction of impurities, a film is formed on the outside of the third thin film layer on the outside of the thin film or the niobium or tin triniobate ($Nb_3Sn$), by use of a PVD method.

The reason tin triniobate ($Nb_3Sn$) is used as the thin superconducting film is because, as shown in FIG. 3, critical temperature Tc and critical magnetic field $H_{c2}$ can be enhanced as can the superconductivity.

The superconducting intermetallic compounds include, for example, NbN, NbC, NbCN, MoN, TaC, ZrC, $Nb_3Al$, $Nb_3(AlGe)$, $Nb_3Ga$, $Nb_3Ge$, $Nb_3Si$, $Nb_3Sn$, VaGa, $V_3Si$, $V_2(HfZr)$, $MX_2$, $TaSe_3$, $TaS_2(C_2H_5N)_{\frac{1}{2}}$, $C_9K$, $MxMo_6X_8$, $(RE)Mo_6S_8$, $(RE)Rh_4B_4$, $Li_{1+x}Ti_{2-x}O_4$ $MxWO_3$, or $BaPb_{1-x}Bi_xO_3$.

In the above list of compounds, $MX_2$ represents a transition metal dichalcogenite, intercalation compound, including, for example $NbS_2$, $NbSe_2$, $NbSe_2$, $TaSe_2$. The symbol (RE) denotes a Rare Earth metal.

The method of the present invention provides a thick copper coating layer by electrodeposition on the outside of the thin film, of niobium or superconducting intermetallic compound, and since a thick copper-reinforced coating layer cannot be closely contacted with the thin film of niobium or superconducting intermetallic compound, a third thin film layer uses at least one metal selected from a group consisting of Cu, Ni, Au, Ag, W, Mo, Pt, and Mg having a high thermal conductivity, and the reinforce coating layer of copper is formed on the third thin film layer.

The reason the third thin film layer is formed of a metal having a high thermal conductivity is that the cavity heat can be rapidly dissipated due to the improved thermal conductivity.

It is preferable to form a fiber-reinforced metal (FRM) layer on the outside of the third thin film layer, and the reason is that the thermal expansion coefficient of the copper is decreased, thereby substantially equalizing the thermal expansion coefficient of the copper to that of the superconducting intermetallic compound, such as tin triniobate ($Nb_3Sn$), to prevent it from damaged due to fatigue.

The method of forming the fiber-reinforced metal layer is not limited. The method comprises the steps of winding composite fiber of one of tungsten, carbon, and silicon carbide plated with copper or winding cloth of the composite fiber of one of tungsten, carbon, and silicon carbide plated with copper at a predetermined pitch on the outer periphery of the thin film layer of copper or copper alloy in the thin film layer, and then forming a copper-reinforced coating layer by electrodeposition.

Further, the method of the present invention preferably provides a cooling metal pipe as the outermost layer, and the reason the pipe is provided is that ordinarily, a refrigerant such as liquid helium is filled in a conventional tank to cool the cavity. The cavity is dipped in the liquid helium, in order to be cooled, so that the facility cost, the managing cost, and the refrigerant cost are remarkably high.

Therefore, the method of the present invention uses the cooling metal pipe as described above, and feeds the refrigerant through the pipe, thereby inexpensively and efficiently cooling the superconducting cavity.

A method of providing the cooling metal pipe comprises the steps of winding the pipe of copper or copper alloy, aluminum or aluminum alloy, or copper or aluminum fiber reinforced metal at a predetermined pitch on the outside of the copper-reinforced coating layer by electrodeposition, point-bonded by soldering to fix the pipe, and then plating with copper on the outside thereof by electrodeposition.

The cross-sectional shape of the pipe is not limited, but the winding step can be facilitated and location of the pipe stabilized by forming the sectional profile in a square or hexagonal shape.

The final process in the method of the present invention involves dissolving the core and then dissolving and removing the first thin film layer. The core-dissolving solution must cause which has less corrosion and must not embrittle niobium or the superconducting intermetallic compound.

It is necessary to avoid roughening the surface by action of the dissolving solution or hydrogen embrittlement of the niobium or the superconducting intermetallic compound at the dissolving time. The solution can be phosphoric acid, hydrochloric acid, sulfuric acid, nitric acid, tartaric acid, lactic acid, acetic acid, carbolic acid, hydrogen peroxide.

It is necessary to electrolytically or chemically polish to remove the oxide film and the contaminants formed on the surface of the thin superconducting film and provide a mirror-surface thereon.

BRIEF DESCRIPTION OF THE DRAWINGS

FIGS. 2(A), 2(B), and 2(C) are sectional views of cavity-type hollow elements, wherein FIG. 2(A) is a cross-shaped sectional shape, FIG. 2(B) is a cross-shaped sectional coupler, and FIG. 2(C) is a cross-shaped sectional shape;

FIGS. 4A, 4B, 4C, 4D, 4E, 5A, 5B, 5C, 5D, 5E, 5F, 5G, 5H, 6A, 6B and 6C are views showing an embodiment of superconducting cavities according to the method of the present invention.

DETAILED DESCRIPTION OF THE PREFERRED EMBODIMENTS

A method of fabricating superconducting cavities of the invention will now be described with reference to the embodiments.

EXAMPLE 1

Figure 4A:
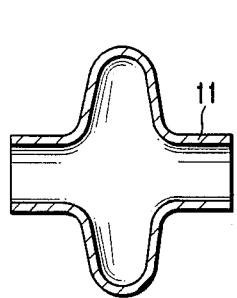
Figure 4B:
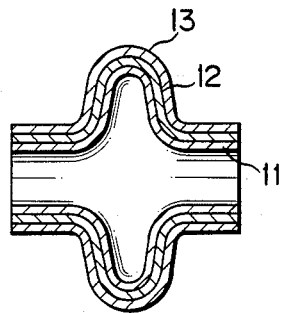
Figure 4C:
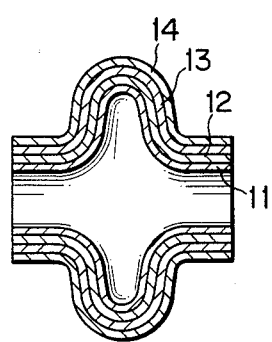
Figure 4D:
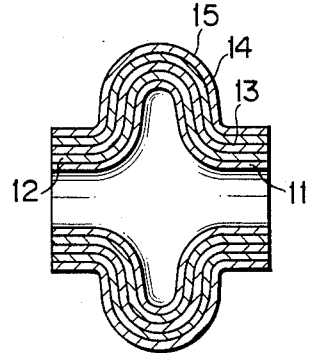
Figure 4E:
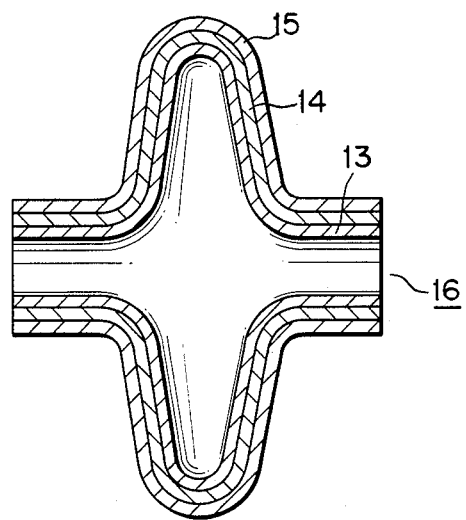

Referring to FIGS. 4(A) to 4(E), first thin film layer 12 was formed by coating nickel to a thickness of 3 microns on the outer periphery of core 11 of aluminum-magnesium alloy of 4.5 wt.% magnesium, formed to have the same outside size as the inside of a superconducting cavity to be fabricated, as shown in FIG. 4(A), second thin film layer 13 of niobium 10 microns thick was bonded on the outside of the first layer by ion plating coating, third thin film layer 14 of nickel was coated in a thickness of 5 microns on the outside of the second layer by ion plating coating, and copper-coating layer 15 of 3 mm thick was bonded by an electro-plating method.

Then, the surface of layer 15 was polished, to form a smooth surface, the core of aluminum alloy was then dissolved and removed by hydrochloric acid, and the first nickel layer was then dissolved and removed by nitric acid, to produce superconducting cavity 16 of the present invention.

EXAMPLE 2

Referring to FIGS. 5(A) to 5(H), first thin film layer 18 was formed by coating copper to thickness of 3 microns on the outer periphery of magnesium-aluminum core of alloy tube 17 of 4.5 wt% magnesium having 0.3 micron of surface roughness and 100 mm outer diameter, 600 mm length and 3 mm thickness, as shown in FIG. 5(A), by ion plating coating while rotating tube 17. Second thin film layer 19 of niobium 10 microns thick was bonded by ion plating coating on the outside of the first layer, third thin film layer 20 was coated by copper ion plating coating, to a thickness of 5 microns on the outside of the second layer to conduct the steps in FIGS. 5(B) to 5(D). Then, copper-reinforced coating layer 21 2 mm or more thick was coated by an electro-plating method, as shown in FIG. 5(E).

Then, the surface of layer 21 was polished, to form a smooth surface, as shown in FIG. 5(F), water was pressure-fed inside the pipe of aluminum alloy, to expand the pipe by bulging, to produce hollow element 22 having a cross-shaped sectional shape, as shown in FIG. 5(G).

When the pipe is expanded by bulging, the tube is formed in a predetermined shape by gradually raising the tube expansion rate by annealing the tube once or several times in the course of working. Since the expanding step is executed by interposing the niobium between the aluminum core and the copper-coating layer, in a sandwich shape, even if the rate is increased to 2.7 times or more, the niobium is not embrittled at all by the heat treatment. In the final process, core 17 was dissolved in hydrochloric acid, first layer 18 was then dissolved in nitric acid, to produce superconducting cavity 23 of the present invention, as shown in FIG. 5(G).

Comparison Examples 1 and 2

Figure 1:
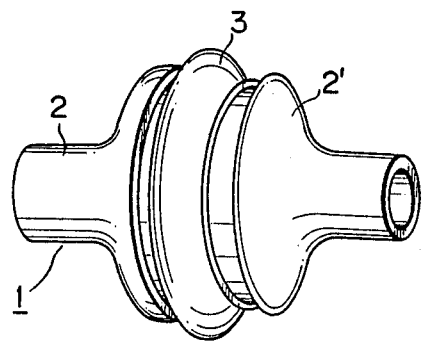
FIG. 1 is a perspective view of a conventional superconducting cavity.
Figure 2A:
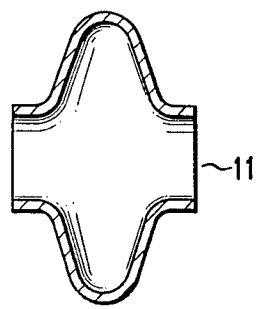
Figure 2B:
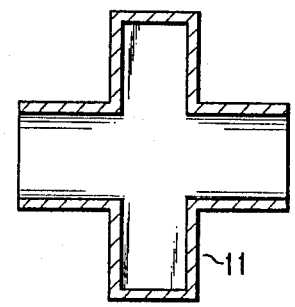
Figure 2C:
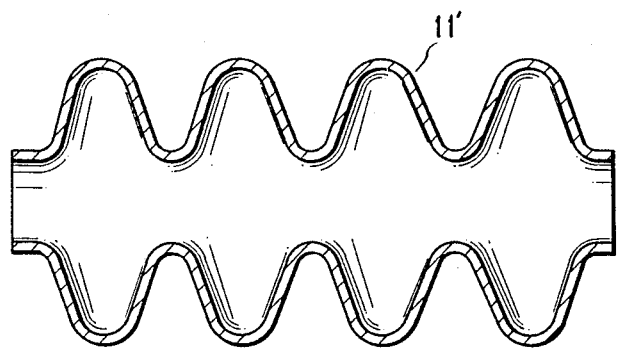
Figure 3:
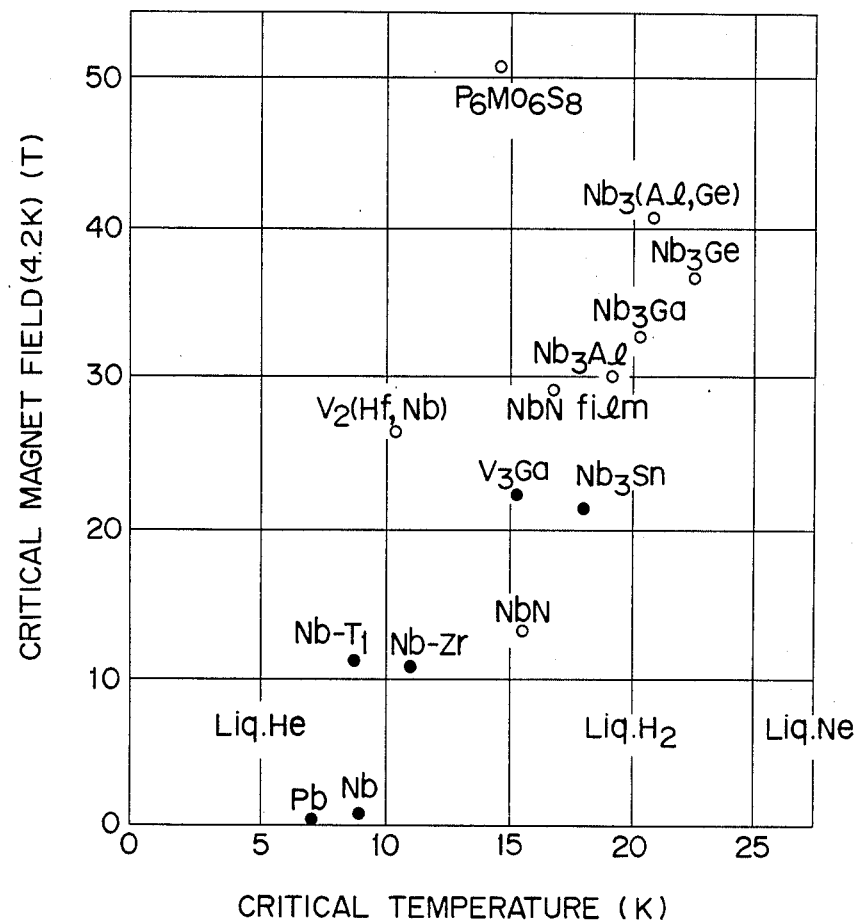
FIG. 3 is a graph showing the relationship between critical temperature Tc and critical magnetic field $H_{c2}$.

In comparison with the method of the present invention, a cavity element, as shown in FIG. 1, was bonded by an electron beam welding method, to produce a superconducting cavity (as comparison example 1). Further, a superconducting cavity (as comparison example 2) according to the method in the aforementioned Japanese Patent Application No. 116691/1984 was produced.

In order to compare the performances of the superconducting cavities produced according to the method of the present invention (example 1) and the method of the comparison example, Q values and accelerating electric fields were measured. The results are shown in Table 1.

The Q value is represented by the following formula:

$$Q \text{ value} = \frac{G \text{ (shape coefficient)}}{R \text{ (Surface resistance)}}$$

TABLE 1

|  | Q value | Accelerating electric field |
|---|---|---|
| This invention | $5 \times 10^9$ | 9 MV/m |
| Comparison (1) | $3 \times 10^9$ | 5 |
| Comparison (2) | $1 \times 10^7$ | 6 |

As is apparent from Table 1, it can be recognized that the superconducting cavity produced by the method of the present invention has excellent superconducting performance.

EXAMPLE 3

Referring to FIGS. 6(A) to 6(C), first thin film layer 18 shown in FIG. 6(B), was formed by coating nickel to a thickness of 3 microns on the outer periphery of core 17 of aluminum-magnesium alloy of 4.5 wt% magnesium, formed having the same outside size as the inside of a superconducting cavity to be fabricated as shown in FIG. 6(A), second thin film layer 19 of $Nb_3Sn$ 10 microns thick was bonded on the outside of the first layer by sputtering, third thin film layer 20 was coated on the outside of the second layer by sputter coating layer 20' of nickel 3 microns thick and by sputter coating layer 20" of copper 3 microns thick. Cloth 24 made of carbon fiber 7 microns in diameter and placed with copper was entirely wound on the outside of the third layer, point-bonded by soldering, and fiber-reinforced metal layer 25 of a copper-reinforced coating layer 2 mm thick was bonded by an electro-plating method.

Then, the surface of layer 25 was polished, to form a smooth surface, core 17 of aluminum alloy was dissolved and removed by hydrochloric acid, and first layer 18 was then dissolved and removed by nitric acid, to produce superconducting cavity 23 of the present invention.

To determine the performance of the superconducting cavity thus produced, the following experiments were conducted:

The thermal expansion coefficients, thermal conductivity, and tensile strengths of the above fiber reinforced metal layer used in the present invention and the copper and $Nb_3Sn$ of the conventional cavity were measured. The results are shown in Table 2.

In Table 2, the fiber volumetric ratio means the ratio of the core of the carbon to the copper of the copper plating.

TABLE 2

|  | Fiber vol. rate (V %) | Thermal expansion coefficient ($\times 10^{-6}$/°C.) | Thermal conductivity (w/cm °C.) | Density (g/cm$^3$) | Tensile strength (kgt/mm$^2$) |
|---|---|---|---|---|---|
| C, FRM | 35 | 9 | 2.5 | 6.3 | 68 |
|  | 45 | 6 | 2.0 | 5.7 | 82 |
|  | 55 | 4 | 1.8 | 5.0 | 95 |
| Cu | — | 17 | 3.9 | 8.9 | 22 |
| $Nb_3Sn$ | — | 6 | — | 9.0 | — |

EXAMPLE 4

A composite fiber, 13 microns in diameter, of tungsten plated with 1 micron-thick copper was wound on the entire periphery, in Example 3, and copper was then electrodeposited on the outside as the fiber-reinforced metal layer, to produce a tungsten fiber-reinforced metal layer 1.2 mm thick. A thin film layer of $Nb_3Ge$ was formed instead of the thin layer of $Nb_3Sn$. The others were all similar to those in Example 3 to produce a superconducting cavity of the invention.

In order to determine the performance of the cavity of the invention, the following experiments were conducted.

The thermal expansion coefficients, thermal conductivity, and tensile strengths of the above fiber-reinforced metal layer used in the present invention and the copper and $Nb_3Ge$ of the conventional cavity were measured. The results are shown in Table 3.

In Table 3, the fiber volumetric ratio means the ratio of the core of the carbon to the copper of the copper plating.

TABLE 3

|  | Fiber vol. rate (V %) | Thermal expansion coefficient ($\times 10^{-6}$/°C.) | Thermal conductivity (w/cm °C.) | Density (g/cm$^3$) | Tensile strength (kgt/mm$^2$) |
|---|---|---|---|---|---|
| C, FRM | 40 | 9.0 | 3.0 | 13.1 | 130 |
|  | 50 | 8.0 | 2.8 | 14.2 | 160 |
|  | 60 | 7.1 | 2.5 | 15.2 | 190 |
| Cu | — | 17 | 3.9 | 8.9 | 22 |
| $Nb_3Ge$ | — | 6 | — | 8.6 | — |

EXAMPLE 5

A superconducting cavity was produced similarly to that of Example 3, except that a thin film layer of $V_3Ge$ was formed instead of the thin film layer of $Nb_3Sn$, and a cloth of the composite fiber, 8 microns in diameter, of silicon carbide plated with 1 micron-thick copper was used as the fiber-reinforced metal layer in Example 5.

To determine the performance of the superconducting cavity thus produced, the following experiments were conducted:

The thermal expansion coefficients, thermal conductivity, and tensile strengths of the above fiber-reinforced metal layer used in the present invention and the copper and $V_3Ge$ of the conventional cavity were measured. The results are shown in Table 4.

TABLE 4

|  | Fiber vol. rate (V %) | Thermal expansion coefficient ($\times 10^{-6}$/°C.) | Thermal conductivity (w/cm °C.) | Density (g/cm$^3$) | Tensile strength (kgt/mm$^2$) |
|---|---|---|---|---|---|
| SiC, FRM | 50 | 9 | 3.5 | 5.7 | 120 |
|  | 60 | 7.7 | 3.4 | 5.1 | 180 |
| Cu | — | 17 | 3.9 | 8.9 | 22 |
| $V_3Ge$ | — | 6 | — | 6.7 | — |

As is apparent from Tables 2 to 4, when the fiber-reinforced metal layer is provided as in the present invention, the thermal expansion coefficient decreases remarkably. Thus, even if a heat cycle was repeated between room temperature and absolute 0° C., no defect was observed in the boundary. However, since copper has very high thermal expansion coefficient, when the copper coating layer was formed directly by electrodeposition on the superconducting intermetallic compound such as $Nb_3Sn$, if the above heat was conducted, a defect occurred in the boundary.

Since it is possible to bring about the increase in the strength and the reduction in the thickness of copper by providing the fiber-reinforced metal layer, the size of the cavity can be smaller than a conventional cavity.

EXAMPLE 6

Figure 7:
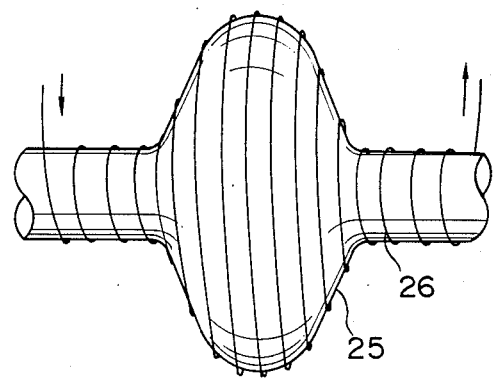
FIG. 7 is an explanatory view of the state wherein a cooling pipe is formed on the outer periphery of the reinforced coating layer in the method of the invention.

Cooling copper pipe 26 of 15 mm diameter was wound at a predetermined pitch on the outside of fiber-reinforced metal layer 25 in Example 3, point-bonded by soldering to fix the pipe, as shown in FIG. 7, the outer periphery was then copper-plated by electrodeposition, then the aluminum core and the first layer were dissolved and removed in similar fashion to Example 3, liquid helium was then fed through the pipe, to produce a superconducting cavity of the invention.

According to the method of the present invention as described above, the following advantages can be provided:

(1) Since the expensive superconductive material can be used in the thin films, the cavity can be produced inexpensively.

(2) Since the superconducting material can be formed by the PVD method from the outer surface, the propriety of the superconducting elements can be readily identified, and since smooth, clean, and ultrafine defect-free mirror-polished film can be provided, the thin superconductive film having less high frequency defects can be provided.

(3) Since the thin superconductive film is formed using the core-dissolving method, even if the superconducting material is reduced in thickness and brittle superconducting material is used, thin superconducting films can be readily formed.

(4) Since no thermal expansion coefficient difference exists between the copper of the stabilized layer and the $Nb_3Sn$ layer, even if the superconducting intermetallic compound such as $Nb_3Sn$ is used as the superconducting material, no defect occurs in the superconductivity even though the heat cycle is repeated, the operation can be stable for a long time, and special facilities and management are not necessary in case of cooling but inexpensive superconducting cavities can be fabricated.

(5) Since the copper coating layer of high purity is formed on the outer periphery of the thin superconductive film, by using the electro-plating method, the cavity heat can be rapidly dissipated due to the improved thermal conductivity.

(6) Though special facility and operating management costs of cryostat in cooling in the conventional technique can be reduced by pipe cooling is performed by winding the copper pipe on the outer periphery of the copper coating layer.

We claim:

1. A method of fabricating a superconducting cavity comprising the steps of:

using a core made of a metal having a higher ionization tendency than hydrogen in the electrochemical series, forming a first thin film layer made of hydrogen transmission-preventive metal on the outer periphery of the core, then closely contacting a second thin film layer of niobium or superconducting intermetallic compound on the outer periphery of the first thin film layer, forming a third thin film layer made of metal having high thermal conductivity and high bondability, on the outside of the second thin film layer, forming a reinforced coating layer of stabilizing metal on the third thin film layer to be formed in the shape of a superconducting cavity, and then removing the core and the first thin film layer by dissolving with the surface of the superconductor being a replica of the core surface.

2. The method according to claim 1, wherein the said core uses at least one selected from a group consisting of Mg, Al, Zn, $Fe^{II}$, Cd, Co, Ni, Sn, Pb, and $Fe^{III}$.

3. The method according to claim 1, wherein said first thin film layer uses at least one selected from a group consisting of Cu, Ni, Fe, Pb, Ag, Cr, Mo, Zn, and Cd.

4. The method according to claim 1, wherein the thickness of the first thin layer is 0.5 micron or larger.

5. The method according to claim 1, wherein the outside size of the core is formed to be the same as the inside of a predetermined superconducting cavity.

6. The method according to claim 1, wherein a reinforced coating layer of stabilizing metal on the third thin film layer is formed in the core such as a linear tube, the interior is then pressurized to expand the tube, to shape the hollow element of a superconducting cavity shape.

7. The method according to claim 1, wherein said third thin film layer uses at least one selected from a group consisting of Cu, Ni, Au, Ag, W, Mo, Pt, and Mg.

8. The method according to claim 1, wherein the second and third thin film layers are formed by use of a PVD (physical vapor deposition) method.

9. The method according to claim 1, wherein the reinforced coating layer is made of copper or aluminum.

10. The method according to claim 1, wherein a copper-reinforced coating layer (FRM layer), by electrodeposition through a winding layer of composite fiber or woven cloth of W, C, or SiC plated with copper or copper alloy, is formed as the reinforced coating layer of the stabilizing metal.

11. The method according to claim 1, wherein a cooling metal pipe is provided through a stabilizing metal layer of Cu on the outside of the hollow element of the superconducting cavity.

12. The method according to claim 1, wherein a copper-reinforced coating layer is formed by electrodeposition through the winding layer, and a cooling pipe is provided through a stabilizing metal layer of copper on the outside thereof.

13. The method according to claim 1, wherein the solution for removing the core and the first thin film layer by dissolving is at least one selected from a group consisting of phosphoric acid, hydrochloric acid, sulfuric acid, nitric acid, tartaric acid, lactic acid, acetic acid, carbolic acid, and hydrogen peroxide.

* * * * *